United States Patent
Dilger et al.

[19]

[11] Patent Number: 6,161,420
[45] Date of Patent: Dec. 19, 2000

[54] HIGH FREQUENCY MEASURING CIRCUIT

[75] Inventors: John P. Dilger, Marshalltown; Nile K. Dielschneider, Conrad, both of Iowa

[73] Assignee: Fisher Controls International, Inc., Marshalltown, Iowa

[21] Appl. No.: 08/968,081

[22] Filed: Nov. 12, 1997

[51] Int. Cl.[7] .......................... H03K 13/14; G01R 23/02; G01R 23/14; H03M 1/10
[52] U.S. Cl. .......................... 73/24.01; 73/23.21; 73/579; 73/658
[58] Field of Search .................................. 73/24.01, 23.2, 73/23.21, 335.02, 592, 579, 658; 324/76.16, 76.23, 76.18, 76.62, 78 D, 78 R, 79 D, 79 R

[56] References Cited

U.S. PATENT DOCUMENTS

| | | | |
|---|---|---|---|
| 3,144,762 | 8/1964 | Testerman et al. | 73/23.1 |
| 3,385,100 | 5/1968 | Michael | 73/23.1 |
| 3,392,571 | 7/1968 | Roof | 73/24 |
| 3,581,304 | 5/1971 | Paradise et al. | 340/347 |
| 3,750,014 | 7/1973 | Glaw, Jr. | 324/79 D |
| 3,879,992 | 4/1975 | Barterg | 73/30 |
| 4,150,561 | 4/1979 | Zupanick | 73/23 |
| 4,198,606 | 4/1980 | Baba | 328/141 |
| 4,215,308 | 7/1980 | Kusters | 324/78 D |
| 4,345,206 | 8/1982 | Skalka | 324/79 R |
| 4,351,181 | 9/1982 | Currans | 73/23 |
| 4,418,566 | 12/1983 | Beck et al. | 73/23 |
| 4,533,867 | 8/1985 | Witczak | 324/78 R |
| 4,544,884 | 10/1985 | Hayashi | 324/78 R |
| 4,555,932 | 12/1985 | Crosby, Jr. | 73/24 |
| 4,603,301 | 7/1986 | Dukes et al. | 329/103 |
| 4,616,173 | 10/1986 | Cook et al. | 324/78 D |
| 4,647,847 | 3/1987 | Roos | 324/79 R |
| 4,651,089 | 3/1987 | Haigh | 324/79 R |
| 4,730,478 | 3/1988 | Gedeon | 73/23 |
| 4,760,536 | 7/1988 | Curtis | 364/484 |
| 4,786,861 | 11/1988 | Hulsing, II et al. | 324/78 R |
| 4,788,646 | 11/1988 | Herzl | 364/484 |
| 4,799,020 | 1/1989 | English | 324/79 R |
| 4,843,328 | 6/1989 | Greenhall | 324/78 Z |
| 4,903,023 | 2/1990 | Evans et al. | 341/120 |
| 5,065,140 | 11/1991 | Neuburger | 340/634 |
| 5,076,094 | 12/1991 | Frye et al. | 73/19.03 |
| 5,201,215 | 4/1993 | Granstaff et al. | 73/54.41 |
| 5,235,844 | 8/1993 | Bonne et al. | 3/24.01 |
| 5,313,820 | 5/1994 | Aylsworth | 73/24.01 |
| 5,465,608 | 11/1995 | Lokshin et al. | 73/24.01 |
| 5,471,402 | 11/1995 | Owen | 364/484 |
| 5,539,346 | 7/1996 | Goto et al. | 327/156 |
| 5,571,944 | 11/1996 | Pfeifer et al. | 73/24.04 |
| 5,604,335 | 2/1997 | Isahaya | 177/210 |
| 5,658,732 | 8/1997 | Ebersole et al. | 435/6 |
| 5,661,233 | 8/1997 | Spates et al. | 73/61.45 |

FOREIGN PATENT DOCUMENTS

| | | |
|---|---|---|
| 787489 | 4/1956 | United Kingdom . |
| 964343 | 7/1964 | United Kingdom . |

*Primary Examiner*—Hezron Williams
*Assistant Examiner*—David J. Wiggins
*Attorney, Agent, or Firm*—Howrey Simon Arnold & White, LLP

[57] ABSTRACT

An electrical circuit and method for measuring small variations in a high frequency signal is disclosed. The circuit generates a coarse measurement of the input signal frequency and a reference signal having the same frequency as the frequency represented by the coarse measurement. The circuit measures the difference in frequency between the input signal and the reference signal, and adds the coarse measurement and the difference measurement to determine the frequency of the input signal. The circuit may be used in conjunction with a piezoelectric acoustic wave device and oscillator to provide an apparatus for accurately measuring low concentrations of a gas.

28 Claims, 9 Drawing Sheets

HIGH FREQUENCY MEASURING CIRCUIT

BACKGROUND OF THE INVENTION

A. Field of the Invention

The present invention relates generally to a circuit for measuring frequency variations in a high frequency signal and, more particularly, to a circuit for measuring the response from a quartz crystal microbalance gas sensor.

B. Description of the Related Art

Piezoelectric acoustic wave devices, including quartz crystal microbalance (QCM) devices, have been used to measure the concentration of moisture and particulates in gas streams, the accumulation of solids in fluid compositions, and similar applications for measuring the concentration of a substance. These acoustic wave devices typically are coated with a material that has an affinity with the substance whose concentration is being measured. The acoustic wave device operates by measuring the amount of the substance deposited onto the surface of the device. This deposit increases the mass of the acoustic wave device and thereby changes the frequency at which the piezoelectric acoustic wave device will resonate. When the acoustic wave device is incorporated into an electrical oscillator circuit, this change in resonant frequency causes the frequency at which the oscillator is operating to change. Thus, the concentration of the substance being measured can be determined by measuring the change in operating frequency of the piezoelectric oscillator circuit.

These acoustic wave devices can be constructed to respond to very low concentrations of the substance being measured, producing a very sensitive sensor. However, when low concentrations are being measured, the change in operating frequency of the piezoelectric oscillator is correspondingly small. The difficulty of measuring these small variations in frequency is increased because of the relatively high frequency at which the piezoelectric oscillator operates, caused by the high resonant frequency of the acoustic wave device.

Several techniques have been used to measure this frequency variation. One method involves resonant frequency determination based upon impedance measurements. This technique is an analog-digital hybrid circuit that is prone to noise, is complex, and expensive to implement. The use of a frequency counter avoids these drawbacks by providing a low cost fully digital circuit that has high noise immunity. However, to accurately measure small variations in the high frequency signals produced by the piezoelectric oscillators, a frequency counter with greater than 16-bit capacity is required, increasing the cost of the circuit.

One method to overcome this problem is to provide two acoustic wave devices, and arrange the devices so that the substance being measured is only deposited onto one of the devices, the other device being a reference (the reference device may be constructed without a coating to attract the substance or with a sealing coating to prevent the substance from being deposited on its surface, or may be positioned where it will not be exposed to the substance being measured). The acoustic wave devices are each connected to a separate oscillator. A frequency measuring circuit receives the output signals from the two oscillators, mixes the two signals to produce a difference frequency signal (having a frequency equal to the difference in frequency between the two oscillator signals), and then measures the frequency of the difference frequency signal. Because the difference frequency is much lower than the oscillator frequencies, a 16-bit counter can be used while still providing the required resolution. However, this approach results in a larger dynamic range for the mixed signal and also a more complex and costly system.

The present invention overcomes these problems by providing a novel circuit and method for measuring small variations in a high frequency signal. Accordingly, it is an object of the present invention to provide an electrical circuit and method for accurately measuring small variations in frequency of high frequency signals. It is also an object of the invention to provide a low cost fully digital frequency measuring circuit that has a high noise immunity. Another object of the invention to provide a frequency measuring circuit that can be constructed by the simple integration of commercially available components.

A further object of the invention is to provide an apparatus and method for measuring low concentrations of a gas. Another object of the invention is to provide an apparatus for measuring gas concentration that is low cost, reliable, and constructed from commercially available components.

SUMMARY OF THE INVENTION

In accordance with one aspect of the invention, there is provided an electrical circuit for measuring the frequency of an input signal. The circuit includes a counter, frequency synthesizer, difference circuit, and summing circuit. The counter generates a coarse measurement of the input signal frequency, and the frequency synthesizer generates a reference signal having the same frequency as the frequency represented by the coarse measurement. The difference circuit generates a fine measurement representing the difference in frequency between the input signal and the reference signal, and the summing circuit adds the coarse measurement to the fine measurement to obtain a final measurement indicative of the frequency of the input signal. The counter may also generate an initial measurement approximating the frequency of the input signal and add or subtract a predetermined amount from the initial measurement to obtain the coarse measurement.

In accordance with another aspect of the invention, the circuit may also be used to measure the concentration of a gas. A gas sensor provides the variable frequency input signal to the circuit described above and the final measurement generated by the circuit is indicative of the concentration of the gas.

In accordance with yet another aspect of the invention, there is provided a method for measuring the frequency of an input signal. The method includes the steps of generating a coarse measurement of the input signal frequency, generating a reference signal having the same frequency as the frequency represented by the coarse measurement, generating a fine measurement representing the difference in frequency between the input signal and the reference signal, and summing the coarse measurement and the fine measurement to obtain a final measurement indicative of the frequency of the input signal. The step of generating the coarse measurement may include generating an initial measurement approximating the frequency of the input signal and adding or subtracting a predetermined amount from the initial measurement to obtain the coarse measurement.

In accordance with still another aspect of the invention, there is provided a method for measuring the concentration of a gas. The method includes exposing a gas sensor to the gas, the gas sensor generating an input signal having a frequency indicative of the concentration of the gas, generating a coarse measurement of the frequency of the input signal, generating a reference signal having the same frequency as the frequency represented by the coarse measurement, generating a fine measurement representing the difference in frequency between the input signal and the reference signal, and summing the coarse measurement and the fine measurement to obtain a final measurement indicative of the concentration of the gas.

BRIEF DESCRIPTION OF THE DRAWINGS

The features and advantages of the present invention will be best appreciated upon reference to the following detailed description and the accompanying drawings, in which.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the appended claims.

DESCRIPTION OF ILLUSTRATIVE EMBODIMENTS

Figure 1:
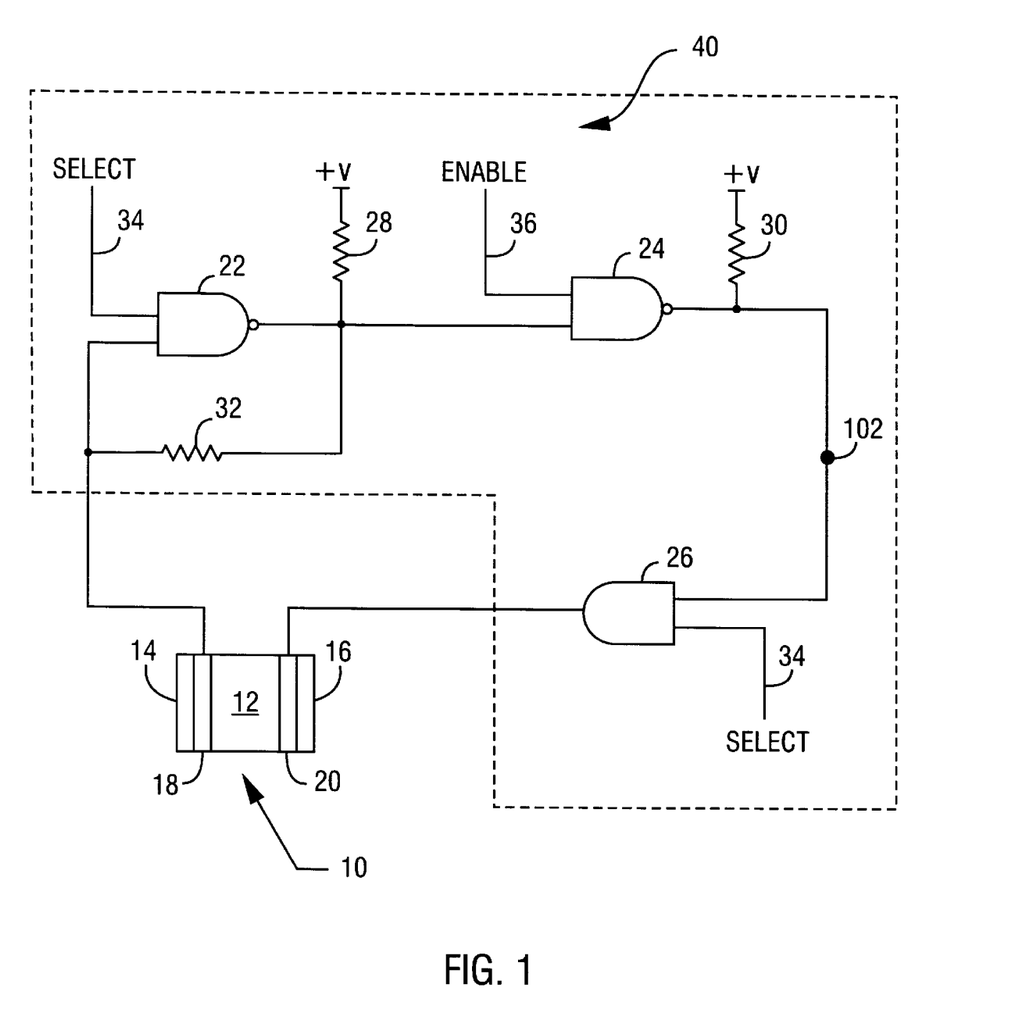
FIG. 1 is a diagram of a quartz crystal microbalance for measuring gas concentration.

Turning now to the drawings and referring initially to FIG. 1, a quartz crystal microbalance (QCM) circuit is shown comprising a QCM gas sensor 10 and oscillator circuit 40. The QCM gas sensor 10 comprises a quartz crystal substrate 12, polymer coatings 14 and 16, and electrodes 18 and 20 located between the substrate and the coatings. The oscillator circuit 40 comprises NAND gates 22 and 24, and AND gate 26, connected in series. Resistor 28 is connected between the output of NAND gate 22 and circuit power supply voltage +V, and resistor 30 is connected between the output of NAND gate 24 and circuit power supply voltage +V. Resistor 32 is connected across NAND gate 22, connecting a first input to the output. A select signal 34 is connected to the second input of NAND gate 22, and the same select signal is also connected to an input of AND gate 26. An enable signal 36 is connected to an input of NAND gate 24.

When the select signal 34 and enable signal 36 are both high, NAND gate 22 and 24 act as high-gain inverting amplifiers and cause oscillator output 102 to oscillate between high and low voltage, producing an oscillating square wave output. The oscillating voltage from the oscillator output 102 is transferred through AND gate 26 and applied across the crystal substrate 12, exerting a physical stress on the crystal due to the piezoelectric effect and causing the QCM gas sensor 10 to physically resonate. The resonating crystal interacts with the oscillating circuit causing the oscillating circuit to oscillate at the resonant frequency of the QCM gas sensor 10. Thus, the frequency of oscillator output 102 will vary as the resonant frequency of the QCM gas sensor 10 varies.

AND gate 26 provides isolation between the oscillator circuit 40 and the QCM gas sensor 10 when the sensor is not selected. The output from NAND gate 24 is connected to a first input of AND gate 26, the second input being connected to select signal 34. When the QCM gas sensor 10 is selected for measurement, select signal 34 is high and the output from AND gate 26 follows any change of state present at its first input. Thus, the oscillating output from NAND gate 24 will be transferred to terminal 20 of quartz crystal substrate 12 and the QCM gas sensor 10 will be connected into the oscillator circuit 40. When the QCM gas sensor 10 is not selected for measurement, select signal 34 is low and the output from AND gate 26 will be low regardless of the signal at the first input of AND gate 26. This will result in the QCM gas sensor 10 being isolated from oscillator circuit 40.

The resonant frequency of the QCM gas sensor 10 is a function of the size, shape, and cut of the quartz crystal substrate 12. Quartz crystal exhibits a natural resonant frequency that is a function of the mass and structure of the crystal. The precise size, type of cut, and thickness of the quartz crystal substrate 12 are selected to result in a particular resonant frequency. An AT-cut crystal with a nominal resonant frequency of 9 MHz is suitable for gas sensor applications. Suitable quartz crystal substrates may be obtained from Standard Crystal Corporation of California. Other types of piezoelectric acoustic wave devices may also be used in place of the QCM gas sensor, including surface acoustic wave (SAW) devices, acoustic plate mode (APM) devices, or flexural plate wave (FPW) devices. However, these alternative devices may have higher operating frequencies of over 100 MHz, and alternative operating modes, necessitating the use of circuitry capable of measuring such high frequencies. The electrodes 18 and 20 may be constructed of gold-on-chromium, although other suitable corrosion resistant conductors may be used.

The resonant frequency of the QCM gas sensor 10 is a function of the total mass of the device. The mass of the polymer coating 14 and 16 affects the total mass of the device, and thereby affects the resonant frequency of the QCM gas sensor 10. When gas molecules are sorbed into or deposited onto the polymer coating 14 and 16, the mass of the polymer coatings is slightly increased, and the resonant frequency of the QCM gas sensor 10 changes. The resonant frequency of QCM gas sensor 10 is also a function of the viscoelectric properties of the coatings, and mechanical stresses caused by temperature effects and the QCM mounting arrangement. However, these effects are either negligible or can be compensated for, allowing the QCM gas sensor 10 of the present invention to function principally as a mass sensor. Thus, a very sensitive gas detector may be constructed by selecting a polymer coating that has a chemical affinity with a particular gas or class of gases of interest.

When the gas of interest comes in contact with the QCM gas sensor 10, gas molecules are absorbed and deposited onto the polymer coating 14 and 16 through various sorption processes. The sorption of gas molecules increases the mass of the QCM gas sensor 10, thereby altering its resonant frequency and causing a corresponding change in the operating frequency of oscillator 30. The quantity of gas molecules absorbed and deposited, and the resulting change in the operating frequency of oscillator 30, is a function of the concentration of the gas being measured in the environment surrounding the QCM gas sensor 10. The frequency changes linearly with change in gas concentration, within certain limits. Some variation in the resonant frequency of the quartz crystal substrate 12 also will occur due to aging of the crystal and temperature effects.

Thus, a change in concentration of the gas of interest may be measured by measuring the change in frequency of oscillator output 102. The gas sensor may be calibrated by exposing the QCM gas sensor 10 to known concentrations of gas and recording the resulting frequency of oscillator output 102. The gas sensor may then be used to measure the absolute concentration of a gas. The gas sensor of FIG. 1 may be designed to detect very low concentrations of gas. However, in order to measure low gas concentrations, a means of measuring small variations in frequency of the oscillator output 102 is required.

Figure 2:
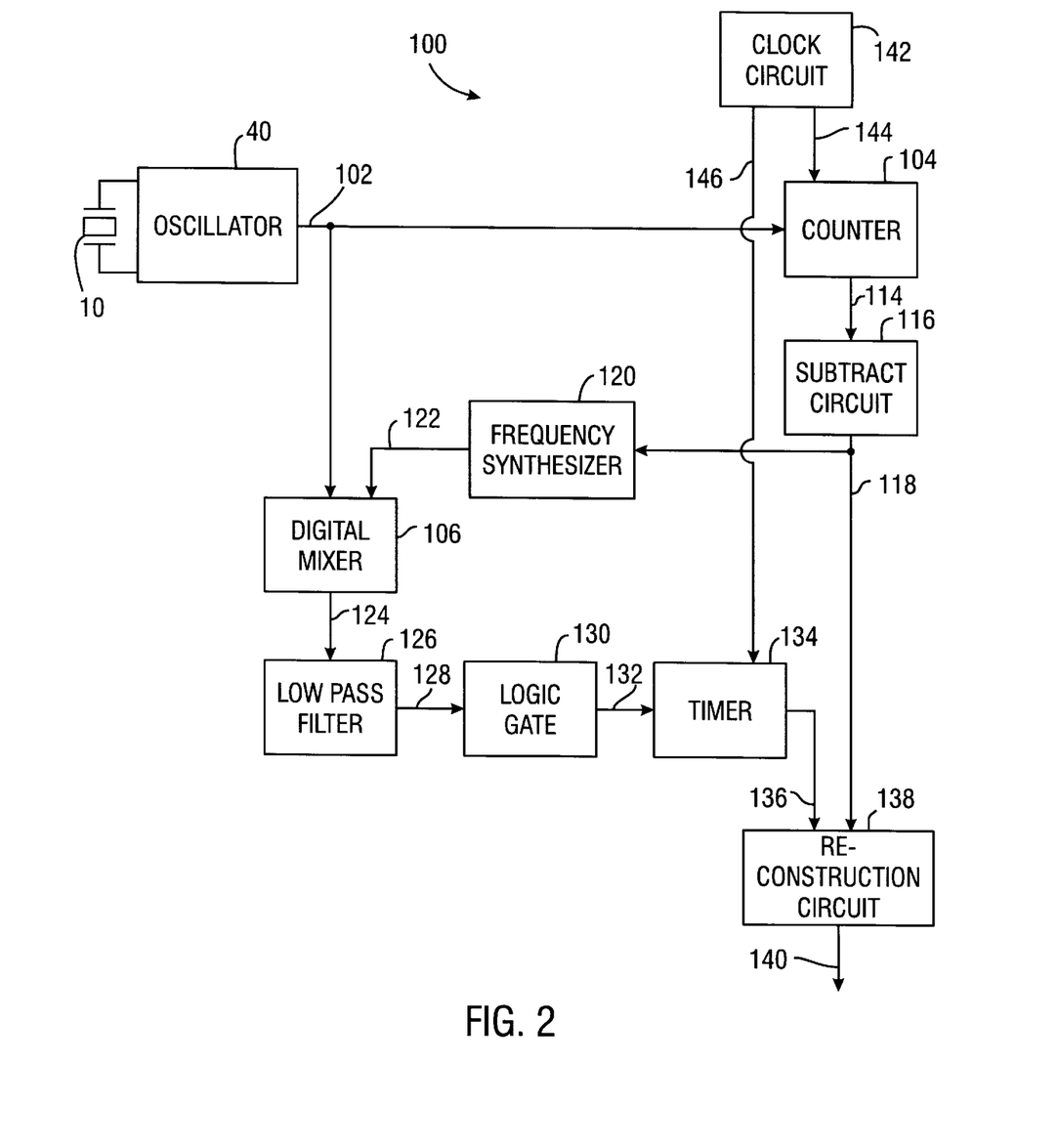
FIG. 2 is a block diagram of a high frequency measuring circuit embodying the present invention.

FIG. 2 is a block diagram of the main functional components of a high resolution frequency measurement circuit 100. The QCM gas sensor 10 and oscillator 40 are shown, and the oscillator output is connected to counter 104 and a first input of digital mixer 106. The counter 104 is connected to subtract circuit 116, which is used to generate "coarse" measurement 118, as described in more detail below. Coarse measurement 118 is an input to digital frequency synthesizer 120, which generates reference frequency 122. Reference frequency 122 is a second input to digital mixer 106. The output of digital mixer 106 is connected to low pass filter 126, whose output is connected to a logic gate 130. The logic gate 130 may be a buffer or inverter, or a Schmitt trigger to provide noise immunity. The logic gate output is connected to timer 134, which is used to generate "fine" measurement 136, as described in more detail below. Coarse measurement 118 and fine measurement 136 are inputs to reconstruction circuit 138, which generates final measurement 140 by summing coarse measurement 118 and fine measurement 136. Clock circuit 142 generates gate signal 144 which is an input to counter 104 and internal clock frequency 146 which is an input to timer 134.

Initially the output of oscillator 40 has the same frequency as the resonant frequency of QCM gas sensor 10, typically 9 MHz. As mentioned earlier, this frequency will vary as a result of the sorption of gas molecules into and onto the polymer coatings 14 and 16 of the QCM gas sensor 10. The counter 104 counts the number of cycles (measured by the rising edges of low to high transitions) of oscillator output 102 (also referred to below as QCM frequency 102). This count is initial frequency measurement 114. Counter 104 is a 16-bit device so the maximum count possible for the 16-bit initial frequency measurement 114 is $2^{16}$ or 65,536. To prevent an overflow in the 16-bit count, the counter 104 must be enabled for a sufficiently short time such that the total expected count is less than 65,536. To prevent such an overflow, the clock circuit 142 generates a periodic gate signal 144 to enable the counter 104 for a short period. The counter 104 counts the number of cycles of QCM frequency 102 that occur between each gate signal.

The gate period selected is dependent on the frequency of the signal being measured. A longer gate period will provide greater resolution, while a shorter gate period will provide for greater variation in the frequency being measured without causing an overflow. For example, a 9 MHz signal will provide 54,000 counts in a 6 ms gate period. The resolution of the 16-bit count for a 9 MHz signal and a 6 ms gate period is 9 MHz/54,000 counts, or approximately 167 Hz (i.e. each count represents approximately 167 Hz). The actual error is not symmetrical due to truncation of the digital values that occurs during count accumulation. However, to precisely calculate the mass of gas molecules sorbed into the polymer coating of QCM gas sensor 10, greater accuracy is required.

Higher resolution is achieved by digitally mixing the QCM frequency 102 with a reference frequency and measuring the difference frequency between the two signals. The reference frequency is derived from the initial frequency measurement 114 produced by the counter 104. One count is subtracted from the initial measurement 114 by subtract circuit 116, and the resulting "coarse" measurement 118 is an input to the digital frequency synthesizer 120. The digital frequency synthesizer 120 generates a reference signal 122 which has a frequency corresponding to the value of coarse measurement 118. The subtraction of one count to give coarse measurement 118 ensures that the frequency of the reference signal 122 is always less than the frequency of QCM frequency 102. This simplifies reconstruction of the final measurement 140 by eliminating the need to determine whether the output from the digital mixer 106 represents a positive or negative difference in frequency (i.e. whether fine measurement 136 should be added or subtracted from the coarse measurement 118).

Reference signal 122 and QCM frequency 102 are both inputs to digital mixer 106. Digital mixing may be accomplished by performing a Boolean Exclusive OR operation on the two inputs. The digital mixing of the two high frequency signals produces a sinusoidally varying pulse width modulated signal 124. The pulse width modulated signal 124 varies sinusoidally due to the periodic phase variations between the frequencies of the reference signal 122 and QCM frequency 102. The pulses are integrated by a first order low-pass filter 126 to remove the high frequency carrier and passed through a logic gate 130 to provide a square wave difference frequency signal 132.

The difference frequency signal 132 is an input to timer 134. The difference frequency signal 132 has a much lower frequency than the QCM frequency 102, and can be measured very precisely. The timer 134 is configured to count the number of cycles of internal clock signal 146 (measured by the rising edges of low to high transitions) during each cycle of difference frequency signal 132. For an internal clock signal 146 with a frequency of 5 MHz, the internal clock cycle time is 200 nanoseconds. Thus, timer 134 increments its count every 200 nanoseconds during one cycle of difference frequency signal 132.

Coarse measurement 118 has the same resolution as initial measurement 114, approximately 167 Hz. The frequency of reference signal 122 is nominally 167 Hz less than QCM frequency 102, because reference signal 122 is generated from coarse measurement 118 which is one count less than initial frequency measurement 114. Thus, the difference in frequency between reference signal 122 and QCM frequency 102 may theoretically vary from approximately 167 Hz to 333 Hz (the actual difference in frequency will be greater due to truncation errors), and the difference frequency signal 132 will thus vary between 167 Hz and 333 Hz. The timer 134 measures this low frequency difference frequency signal 132 with a resolution of at least ±0.1 Hz, to produce "fine" measurement 136.

Finally, the reconstruction circuit 140 adds fine measurement 136 to coarse measurement 118 to produce final measurement 140. Thus, a vernier frequency counter has been developed to accurately determine the operating frequency of the QCM gas sensor 10.

Figure 3:
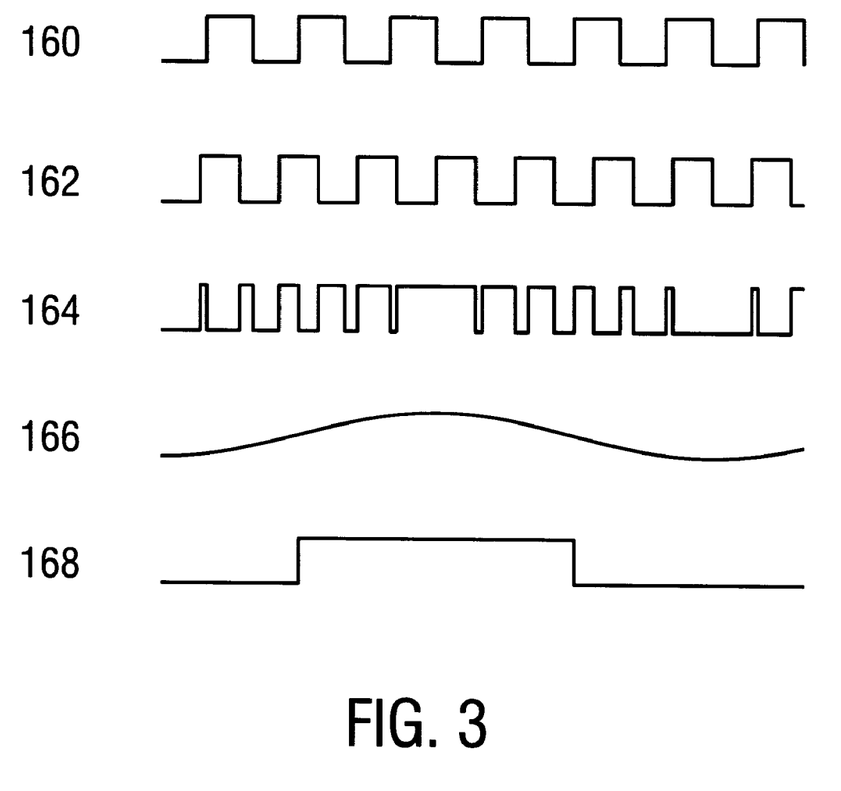
FIG. 3 is a diagram of typical waveforms generated by the high frequency measuring circuit of FIG. 2.
Figure 4A:
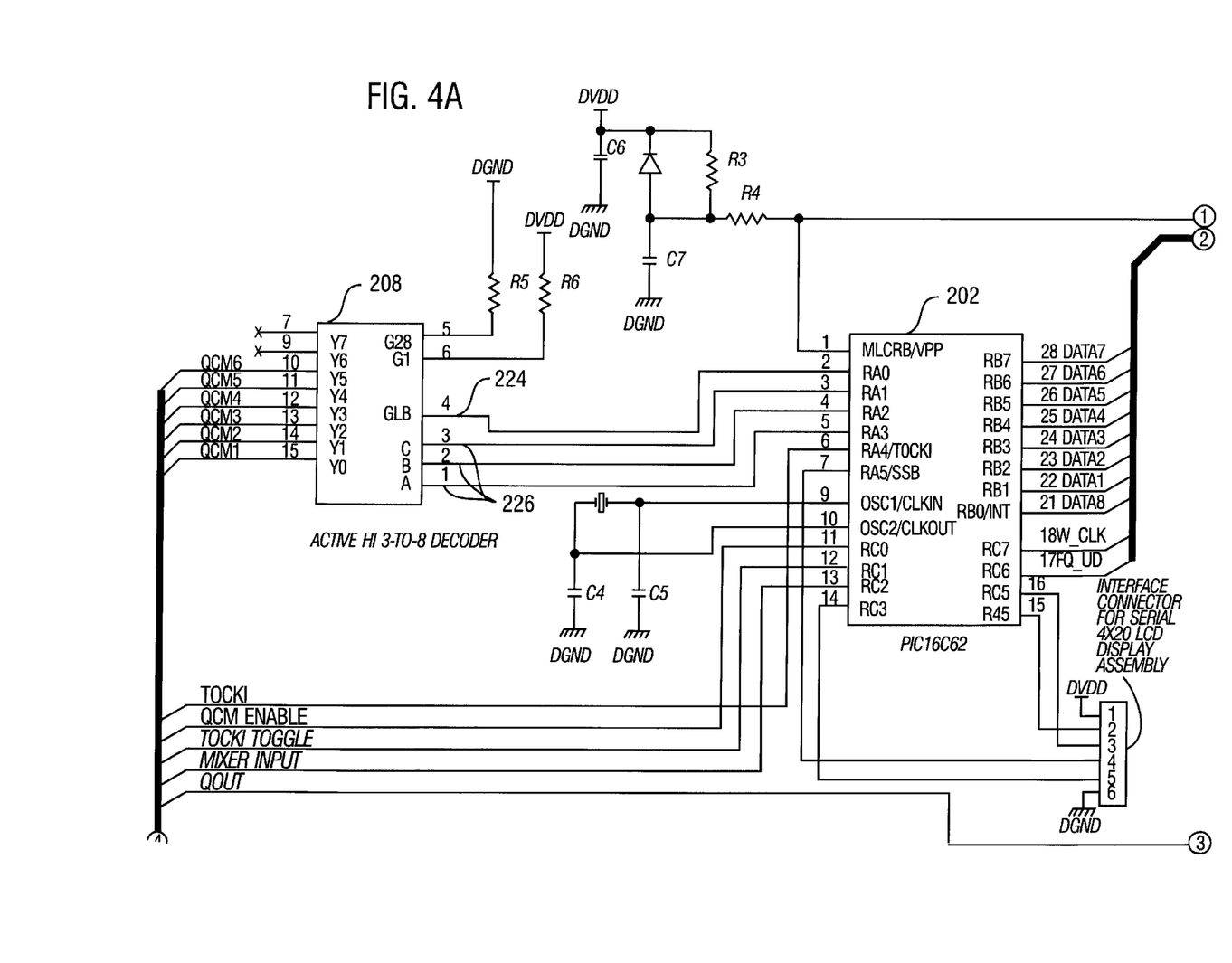
FIGS. 4A–4D show a circuit diagram of the high frequency measuring circuit of FIG. 2.
Figure 4B:
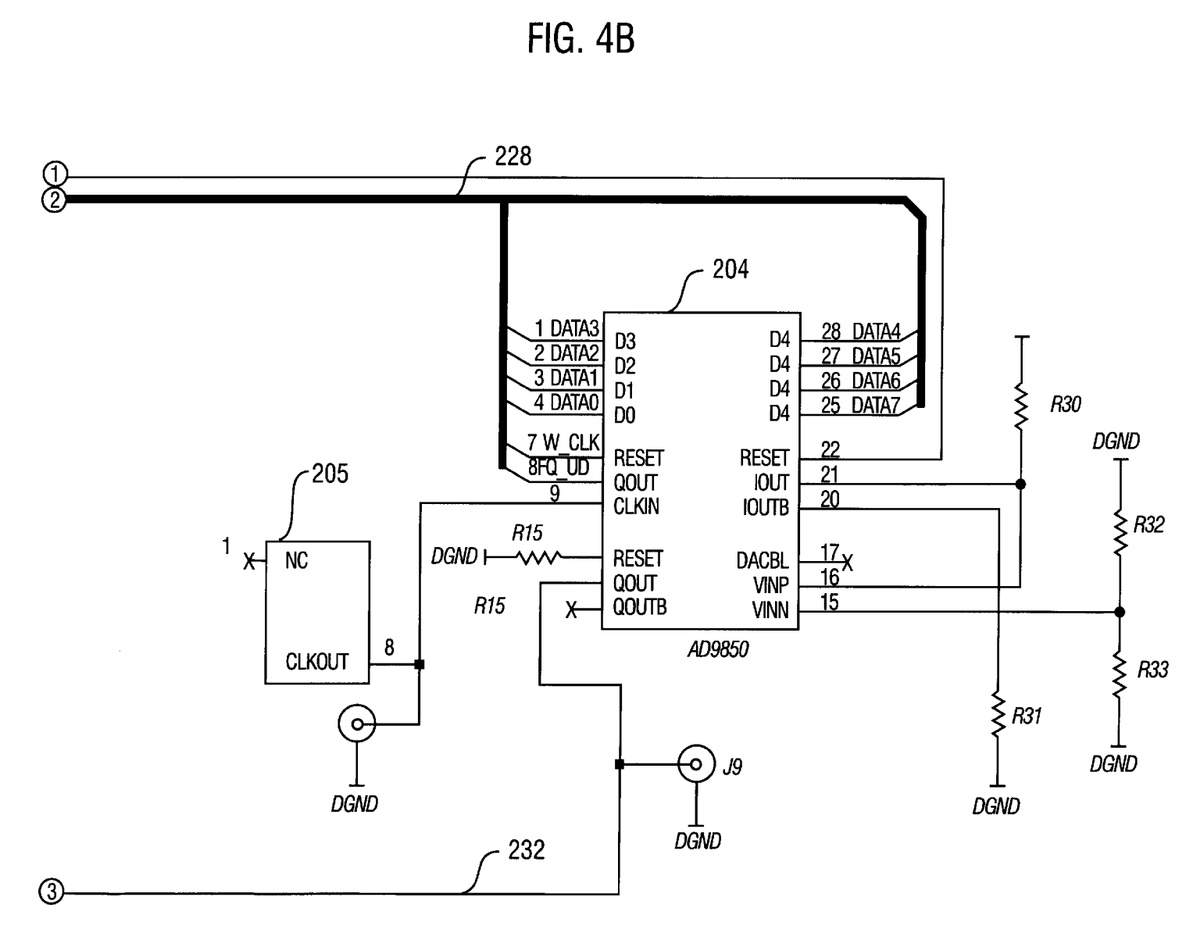
Figure 4C:
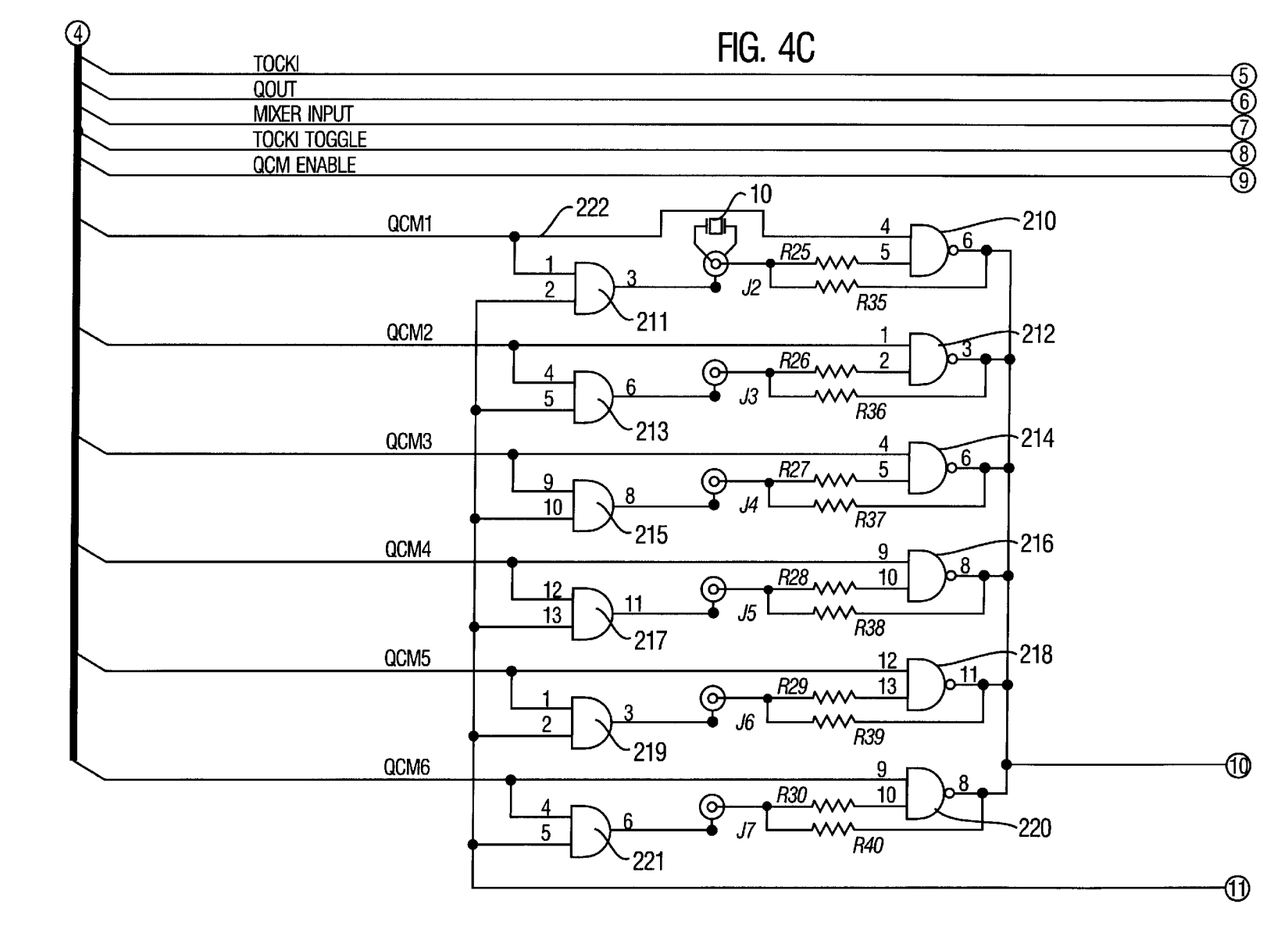
Figure 4D:
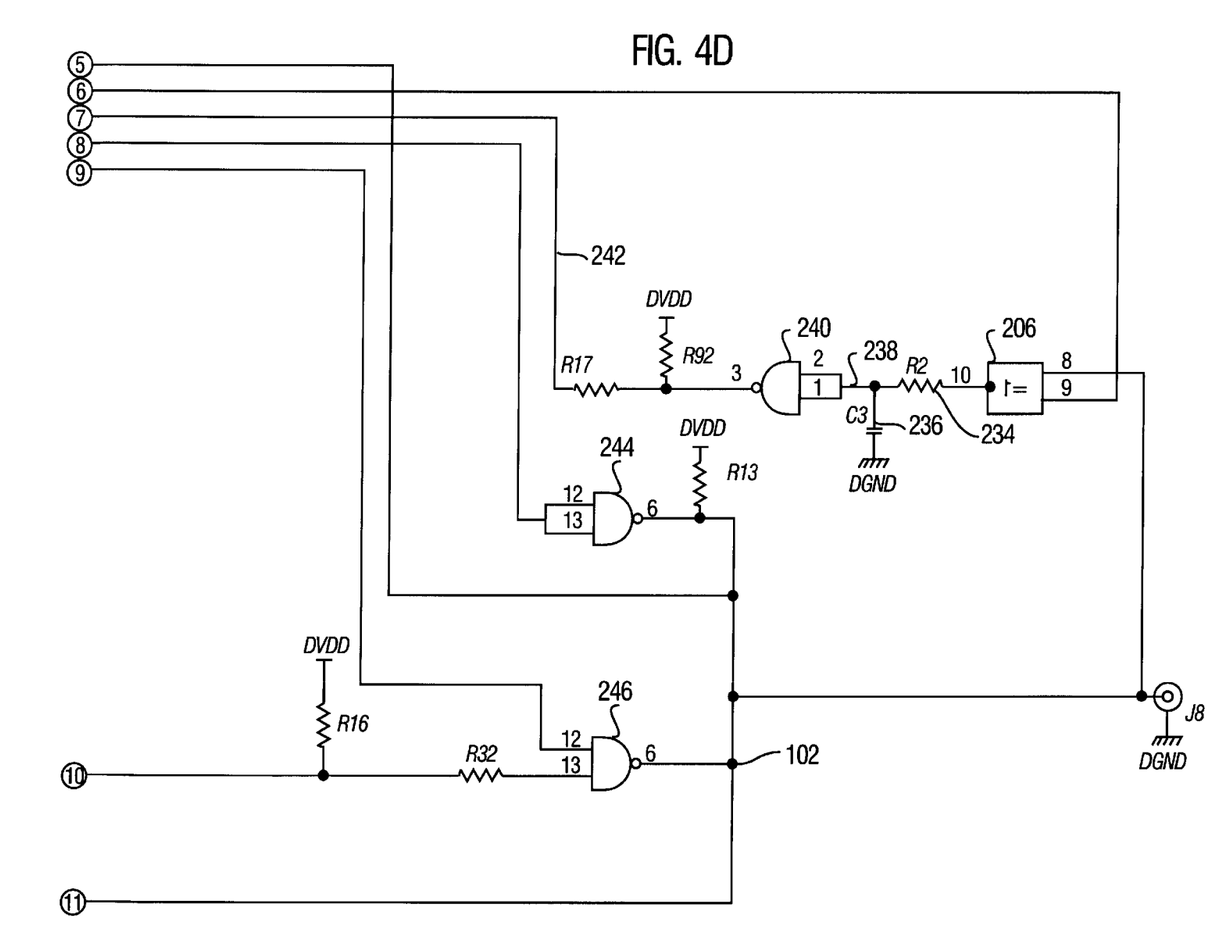

FIG. 3 is a diagram of typical waveforms of various signals generated by the high resolution frequency measurement circuit of FIG. 2. Waveform 160 represents the QCM frequency 102. This is a square wave oscillating at the resonant frequency of the QCM gas sensor 10. The frequency of waveform 160 is a function of the mass of QCM gas sensor 10, which is a function of gas concentration.

Waveform 162 represents reference signal 122. This signal is generated by digital frequency synthesizer 120, and has a frequency determined by the value of coarse measurement 118. Waveform 162 has a lower frequency than waveform 160, because coarse measurement 118 is always less than QCM frequency 102.

Waveform 164 represents the output from digital mixer 106. This waveform is a pulse-width modulated signal created by the phase variance between waveform 160 (QCM frequency 102) and waveform 162 (reference signal 122). The pulse width of waveform 164 varies sinusoidally, and the period of the sinusoidal variation is a function of the difference in frequency between waveform 160 and waveform 162.

Waveform 166 represents the output from low-pass filter 128. The pulses of waveform 166 are integrated by the low-pass filter 126, removing the high frequency carrier and converting the sinusoidal variation of pulse width of waveform 164 into low frequency sinusoidal waveform 166. The frequency of waveform 166 equals the difference in frequency between waveform 160 and waveform 162.

Waveform 168 represents the difference frequency signal 132. Waveform 168 is generated by passing the sinusoidal waveform 166 through logic gate 130 to produce a square wave having the same frequency as waveform 166. Thus, waveform 168 is a square wave having a frequency equal to the difference in frequency between waveform 160 (QCM frequency 102) and waveform 162 (reference signal 122).

Turning now to FIGS. 4A–4D, a circuit to implement a high resolution frequency measurement circuit is shown. The circuit has three main components: a PIC embedded controller 202, a direct digital synthesis (DDS) integrated circuit 204, and a digital mixer 206. The embedded controller 202 contains two 8-bit counter-timers and a 16-bit counter-timer. The embedded controller 202 also contains program and variable memory to provide for control of the counter-timers and analysis of their outputs, and includes a communications port, either serial or parallel, and external address and data bus. The embedded controller 202 also should be capable of executing floating point math algorithms. A suitable controller is the PIC16C62 controller made by Microchip Technology Inc. of Arizona, although other controllers having the required functionality may also be used.

The DDS circuit 204 must be capable of creating periodic waveforms (square or sinusoidal) at frequencies equal to the resonating frequency of a QCM gas sensor. A monolithic DDS integrated circuit model AD9850, made by Analog Devices, Inc. of Massachusetts, is suitable for this application. The AD9850 generates the desired signal with 32-bit resolution. The digital mixer 206 is a single Boolean Exclusive OR gate, of a commonly available type.

Embedded controller 202 is connected to address decoder 208 which is connected to the sensor select gates 210, 212, 214, 216, 218, and 220, and to sensor isolation gates 211, 213, 215, 217, 219, and 221. The sensor select gates and sensor isolation gates each connect to a terminal of a QCM gas sensor and operate to connect the sensors into or isolate the sensors from the high resolution frequency measurement circuit. The following describes the detailed connections and operation of only one of the QCM gas sensors and its sensor select gate and sensor isolation gate, although it can be readily appreciated that additional sensors may be connected similarly and operated in the same manner, and that the high resolution frequency measurement circuit is designed to operate with multiple sensors.

QCM gas sensor 10 has a first terminal 18 (shown in FIG. 1) connected to a first input of sensor select gate 210, and a second terminal 20 (shown in FIG. 1) connected to the output of sensor isolation gate 211. The second input to the sensor select gate 210 and one input from sensor isolation gate 211 are both connected to sensor select line 222 from address decoder 208. Address decoder 208 is connected to controller 202 via sensor select lines 224 and 226. To select a particular sensor to measure, controller 202 generates a select signal on line 224 and a sensor address on lines 226 which is decoded by address decoder 208. Address decoder 208 outputs a high signal on the sensor select line corresponding to the selected sensor (and a low signal on all the other sensor enable lines), causing the corresponding sensor select gate and sensor isolation gate to connect the selected sensor to the oscillator circuit. Thus, to select QCM gas sensor 10, a select signal is generated by embedded controller 202 which causes address decoder 208 to output a high signal on sensor enable line 222. This high signal causes sensor select gate 210 and sensor isolation gate 211 to pass logic signals from QCM sensor 10 to oscillator NAND gate 246, completing the oscillator circuit through the QCM gas sensor 10 and providing feedback from the QCM gas sensor 10 to permit sustained oscillation at the resonant frequency of the sensor. In this way, multiple QCM gas sensors may be connected in parallel across the oscillator circuit, with the sensors being selected one at a time for measurement by embedded controller 202. Alternatively, other common digital techniques may be employed to individually select the sensors.

Upon selection of one of the QCM gas sensors, embedded controller 202 generates a QCM enable signal to enable operation of oscillator NAND gate 246. The oscillator output 102 is connected to a timer-counter input of embedded controller 202. Because the particular model of embedded controller used in this embodiment does not have a 16-bit timer-counter that can be used to generate a coarse measurement of oscillator output 102 (i.e. the function performed by counter 104 in the circuit of FIG. 2), two 8-bit timer-counters are used. The first 8-bit timer-counter (the "8-bit prescaler") counts every cycle of oscillator output 102. The second 8-bit timer-counter increments only after a preset number of cycles (the "8-bit counter"). In this application, the 8-bit counter increments only once every 256 cycles of the oscillator output 102. Together, the 8-bit counter and 8-bit prescaler provide a 16-bit count of oscillator output 102; the 8-bit prescaler providing the least significant 8 bits and the 8-bit counter providing the most significant 8 bits of the 16-bit count. The outputs from the 8-bit counter and 8-bit prescaler are concatenated by the embedded controller 202 to yield a 16 bit count. This count is the initial frequency measurement 114, described above in the discussion of FIG. 2.

The following example illustrates the method of deriving a full 16 bit count from outputs of the 8-bit counter and 8-bit prescaler. If the oscillator output 102 is 9 MHz and the gate time is 6 ms, then the number of counts recorded by the 8-bit counter is $(9 \times 10^6 \text{ Hz}) \times (6 \times 10^{-3} \text{ s})/256 = 210.9375$ counts. The 8-bit counter increments every 256 cycles of the oscillator output 102, yielding a counter value of 210 or D2 [base 10]. This value is the upper 8 bit of the total 16-bit count of initial frequency measurement 114. The 8-bit prescaler increments on every cycle of the oscillator output 102. The 8-bit prescaler rolls over at 256 counts, so the number of counts recorded is the fractional count (the count remaining in the counter at the end of the 6 ms gate period), equal to 0.9375×256, which equals 240 [base 10] or F0 [base 16]. This value is the lower 8 bits of the 16bit initial frequency measurement 114. The full 16 bit value is thus D2F0 [base 16].

However, the embedded controller 202 can only access the count accumulated by the 8-bit counter. To derive the full 16-bit count, embedded controller 202 performs the following steps. First, embedded controller 202 sends a QCM enable signal (i.e. a high logic voltage) to oscillator NAND gate 246 for a 6 millisecond gate period. During this period, the 8-bit counter and 8-bit prescaler count the pulses appearing at oscillator output 102. At the end of the gate period, the QCM enable signal is removed which disables the oscillation of oscillator output 102, and embedded controller 202 stores the count accumulated by the 8-bit prescaler. To determine the count accumulated by the 8-bit prescaler, embedded controller 202 then toggles the input to NAND gate 244 from high to low, causing oscillator output 102 to toggle from low to high, which causes the 8-bit prescaler to accumulate additional counts. Embedded controller 202 continues to toggle the input to NAND gate 244 until the 8-bit prescaler overflows, causing the 8-bit counter count to increase by one count. Embedded controller 202 then subtracts the number of toggles required to cause this overflow from 256 to calculate the count accumulated by the 8-bit prescaler during the 6 millisecond gate period. Lastly, embedded controller concatenates this derived count with the stored count from the 8-bit counter to result in the 16-bit initial frequency measurement 114

The frequency of the oscillator output 102 will be the frequency at which the QCM gas sensor is resonating, typically 9 MHz, and the model of embedded controller 202 used in this embodiment cannot measure such a high frequency directly. The internal clock of the embedded controller 202 is limited to one fourth the rate of the master clock frequency, resulting in an internal clock frequency of 5 MHz for a typical master clock frequency of 20 MHz. To permit the embedded controller 202 to measure the 9 MHz frequency, the oscillator output 102 is used as the clock input to the 8-bit counter and 8-bit prescaler, and a fixed frequency signal having a 6 ms period is generated from the internal clock and is used as the other input. In this configuration, the 8-bit counter and 8-bit prescaler count the number of cycles of oscillator output 102 occurring during a 6 ms gate period.

The 16-bit count of cycles occurring during the gate period is the initial measurement 114 of the frequency of oscillator output 102. Embedded controller 202 subtracts one count to from initial measurement 114 to produce a coarse count. The embedded controller 202 then performs a floating point calculation to convert the integer coarse count to coarse measurement 118 in engineering units. The coarse count is divided by the gate period to convert the integer count value into a frequency value. For example, a QCM frequency of 9.12345 MHz and a 6 millisecond gate period will result in a initial measurement 114 of: 9.12345 MHz× 6×10$^{-3}$ s=54740 [base 10] or D5D4 [base 16]. Subtracting one count yields a coarse count of D5D3 [base 16]. Thus, the coarse measurement 118 in engineering units is: D5D3 [base 16]×6×10$^{-3}$ s=9.123166667 MHz.

However, the DDS 204 requires an integer input scaled to its clock frequency. To produce the DDS input, the embedded controller 202 converts the engineering unit coarse measurement 118 into an integer control word for input to the DDS 204. The DDS control word is calculated by multiplying the coarse measurement 118 by the full-scale count value of the 32-bit DDS 204, and dividing by the DDS clock frequency. For example, using the data given above and assuming the DDS 204 has a clock frequency of 50 MHz, the DDS control word would be: 9.123166667 MHz× 2$^{32}$/50 MHz=783,674,049 [base 10] or 2EB5EAC1 [base 16].

The embedded control transmits the DDS control word and control signals on data lines 228 to DDS 204. DDS 204 generates reference frequency 122 (shown in FIG. 2) having a frequency equal to the frequency represented by the control word (which is the same frequency as that represented by coarse measurement 118) from embedded controller 202, transmitting the result on DDS output 232. Digital mixer 206 receives DDS output 232 (the reference frequency 122) and oscillator output 102. The digital mixer 206 performs an Exclusive OR operation on the two inputs to produce a pulse width modulated output. This output passes through a simple single-pole filter comprising resistor 234 and capacitor 236. The output 238 from the low pass filter 126 is fed to buffer 240, comprising an open collector NAND gate, to provide a square wave at output 242 to the 16-bit counter-timer ("the 16-bit timer") of embedded controller 202.

The 16-bit timer produces a fine count equal to the number of cycles of the internal clock signal of the embedded controller 202 (measured by the rising edges of low to high transitions) for one cycle of the oscillator output 102. Embedded controller 202 converts the integer fine count into fine measurement 136 in engineering units by dividing the embedded controller 202 internal clock frequency by the fine count. For example, if the embedded controller clock frequency is 5 MHz, a fine count of 17647 [base 10] or 44EF [base 16] would yield a fine measurement 136 of: 5 MHz/ 44EF=283.334 Hz. Because the fine count (representing the difference frequency 124 of FIG. 2) is much less than internal clock frequency of the embedded controller 202, the resulting fine measurement 136 has a very high resolution.

To calculate final measurement 140, embedded controller 202 performs a floating point add of coarse measurement 118 and fine measurement 136. Lastly, embedded controller 202 converts the floating point final measurement 140 into a format suitable for transmission over a serial communication link to a central monitoring or control system.

A typical reading profile involves enabling each of the individual QCM gas sensors one at a time taking a measurement for each one. A final measurement 140 is calculated for each QCM gas sensor and transmitted to the central monitoring or control system with appropriate information identifying which sensor generated the data.

Figure 5A:
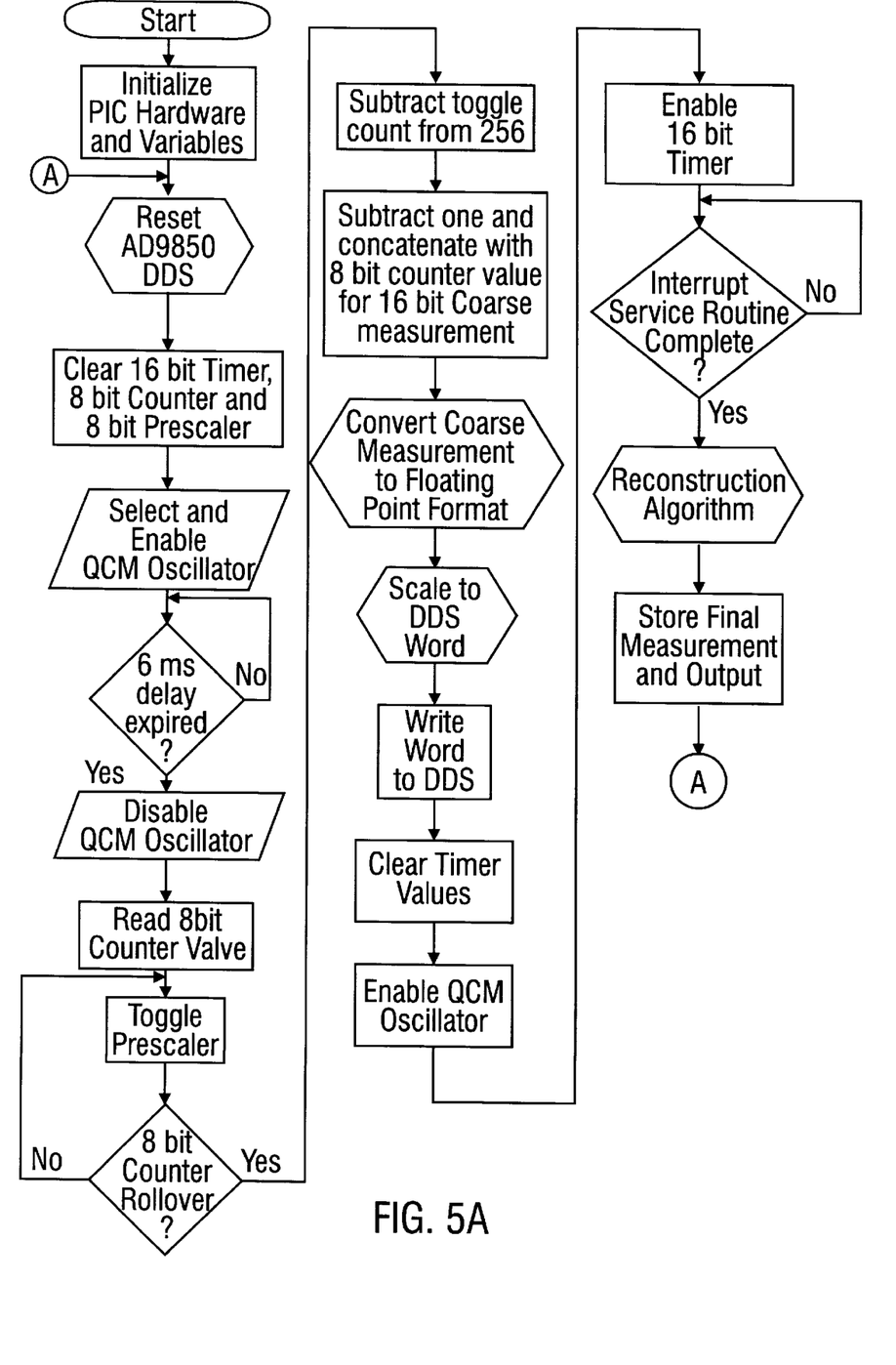
FIG. 5A is a flowchart of a software program used to by the embedded controller of FIG. 4A to implement a high frequency measuring circuit.
Figure 5B:
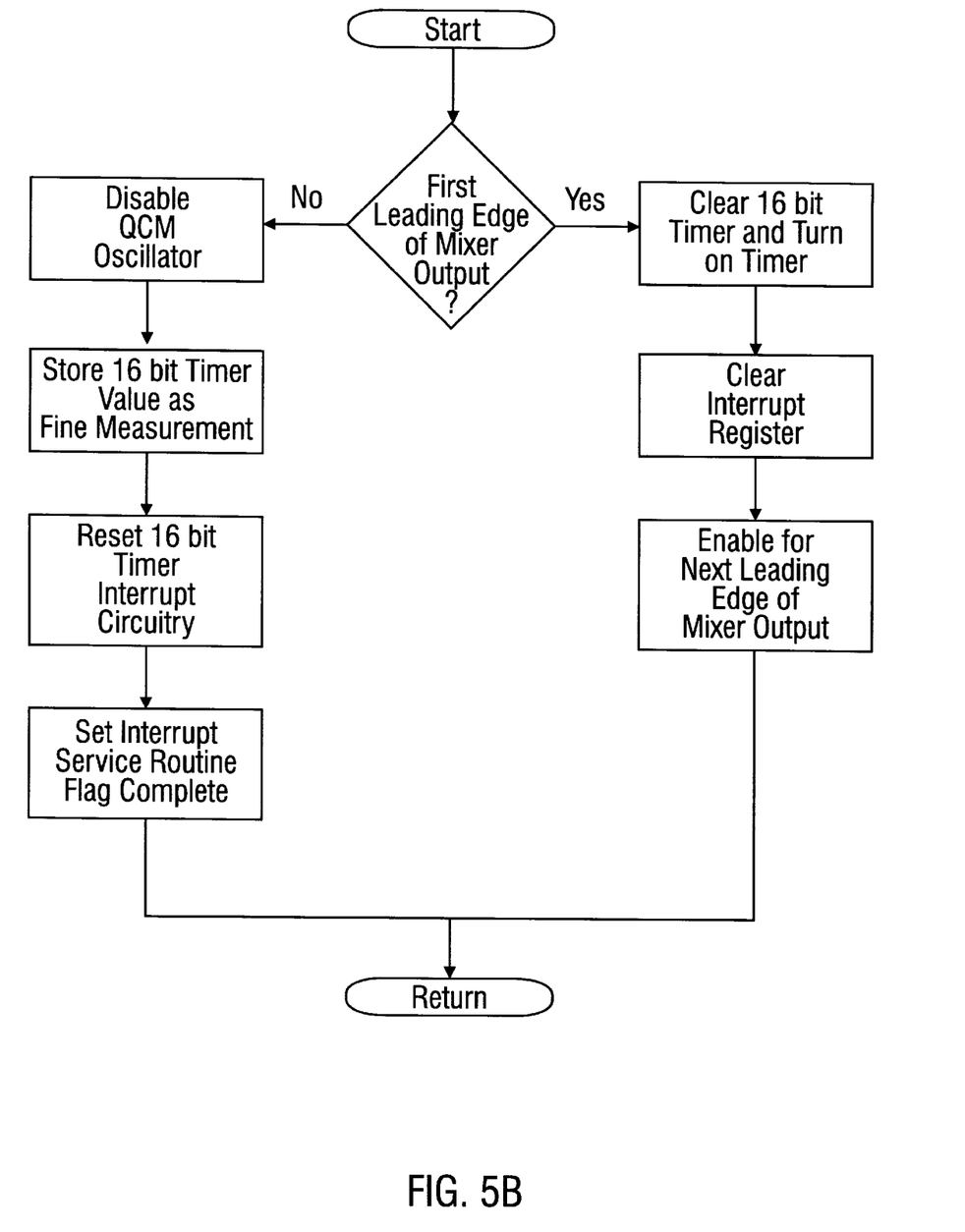
FIG. 5B is a flowchart of an interrupt service routine used by the embedded controller of FIG. 4A to implement a high frequency measuring circuit.

The above described functions of the embedded controller 202 may be implemented according to the software program flowchart depicted in FIG. 5A and the interrupt service routine flowchart depicted in FIG. 5B. FIG. 5A shows the main program which executes cyclically to implement the high frequency measuring circuit. Upon initial startup, the PIC embedded controller 202 is initialized and the variables stored within the PIC embedded controller 202 are reset. The program then enters a loop, beginning with a reset of the DDS 204 and clearing of the embedded controller's 16-bit timer, 8-bit counter, and 8-bit prescaler values. A QCM gas sensor is then selected for measurement and an enable signal sent to the oscillator NAND gate 246 to enable the QCM oscillator circuit.

At the end of a 6 millisecond delay, a disable signal is sent to the oscillator NAND gate 246, the accumulated count value of the 8-bit counter is read and temporarily stored by the embedded controller 202. The embedded controller 202 then sends signals to toggle the input to NAND gate 244 to cause the 8-bit prescaler to accumulate additional counts. The toggle signals are sent until the 8-bit counter increments by one count. The embedded controller 202 keeps an accumulated count of the number of toggle signals sent and subtracts this count from 256. One count is then subtracted from the resulting value, and it is concatenated with the previously stored 8-bit counter value to give a 16-bit coarse measurement. This coarse measurement is then converted to floating point format and scaled to produce a word suitable for input to the DDS 204. The 16-bit timer of the embedded controller 202 is cleared, an enable signal sent to the oscillator NAND gate 246, and the 16-bit timer enabled.

The program then waits for the interrupt service routine, shown in FIG. 5B and described below, to complete. The output from digital mixer 206 drives the input to the interrupt circuit, and completion of the interrupt service routine indicates that one complete cycle of the output of digital mixer 206 has occurred and the 16-bit timer has accumulated a fine measurement count. The embedded controller 202 then performs the reconstruction algorithm to derive the final measurement from the coarse measurement and fine measurement values previously obtained. The embedded controller 202 stores the final measurement value and outputs the value onto the embedded controller's data bus. The program execution then returns to the beginning of its loop, resets the DDS 204, and continues execution as described above.

The interrupt service routine shown in FIG. 5B starts when a leading (or rising) edge of the output from digital mixer 206 is detected by the embedded controller 202 and an interrupt signal generated. The first execution of the interrupt service routine will proceed down the right leg of the flowchart. The 16-bit timer is cleared and turned on, the interrupt register cleared and enabled to permit detection of a second leading edge of the output from digital mixer 206. The second execution of the interrupt service routine, triggered by detection of a second leading edge of the output of digital mixer 206, begins execution of the left leg of the flowchart. A disable signal is first sent to oscillator NAND gate 246 to disable the QCM oscillator circuit. The embedded controller 202 then stores the accumulated value from the 16-bit timer as the fine measurement. The 16-bit timer is reset, the interrupt circuitry is reset, and a flag is set to indicate that the interrupt service routine has completed.

The flowcharts illustrate one method of programming the embedded controller 202 to implement the high frequency measuring circuit of the present invention, although many other methods may be used that will be apparent to one of ordinary skill in the art. From the above it can be appreciated that a measuring circuit has been described that is able to accurately measure small variations in frequency of a high frequency signal. The circuit uses commercially available digital components to provide a low cost circuit. The measuring circuit also provides for very fast acquisition of the frequency measurement, thus minimizing power consumption and facilitating industrial field deployment. Many modifications and variations may be made in the techniques and structures described and illustrated herein without departing from the spirit and scope of the present invention. Accordingly, it should be understood that the methods and apparatus described herein are illustrative only and are not limiting upon the scope of the present invention.

What is claimed is:

1. An electrical circuit for measuring the frequency of an input signal, said circuit comprising:

a) a counter connectable to receive said input signal for generating a coarse measurement of said frequency of said input signal;

b) a frequency synthesizer having an input connected to said counter to receive said coarse measurement for generating a reference signal having a frequency equal to the frequency represented by said coarse measurement;

c) a difference circuit connected to said frequency synthesizer for generating a fine measurement representing the difference in frequency between said input signal and said reference signal; and d) a summing circuit connected to said counter and said difference circuit, for summing said coarse measurement and said fine measurement, thereby obtaining a final measurement indicative of said frequency of said input signal.

2. The circuit of claim 1 wherein said frequency of said reference signal is lower than said frequency of said input signal.

3. The circuit of claim 1 wherein said frequency of said reference signal is decreased by a predetermined amount so that said frequency of said reference signal is lower than said frequency of said input signal.

4. The circuit of claim 1 wherein said difference in frequency between said input signal and said reference signal is maintained within a predetermined range.

5. The circuit of claim 1 wherein said counter generates an initial measurement approximating said frequency of said input signal and changes said initial measurement by a predetermined amount to obtain said coarse measurement.

6. The circuit of claim 1 wherein said input signal is generated by a gas sensor and said final measurement is indicative of the concentration of a gas.

7. The circuit of claim 1 wherein said difference circuit comprises a digital mixer for receiving said input signal and said reference signal and generating a pulse width modulated signal.

8. The circuit of claim 7 wherein said digital mixer is a Boolean Exclusive OR gate.

9. The circuit of claim 7 wherein said difference circuit further comprises a low pass filter connected to said digital mixer, for integrating said pulse width modulated signal to generate a sinusoidal signal.

10. The circuit of claim 9 wherein said difference circuit further comprises a logic gate connected to said low pass filter, for converting said sinusoidal signal to a square wave signal.

11. The circuit of claim 10 wherein said difference circuit further comprises a timer connected to said logic gate, for measuring the frequency of said square wave.

12. The circuit of claim 11 wherein said counter, said timer, and said summing circuit are implemented in an embedded controller.

13. The circuit of claim 11 wherein said counter comprises a plurality of subcounters each having an output, said outputs of said subcounters being concatenated to produce said initial measurement.

14. The circuit of claim 11 wherein said input signal is generated by a gas sensor and said final measurement is indicative of the concentration of said gas.

15. The circuit of claim 14 wherein said gas sensor comprises a piezoelectric acoustic wave device.

16. The circuit of claim 14 wherein said gas sensor comprises a quartz crystal microbalance.

17. The circuit of claim 14 wherein said counter generates an initial measurement approximating said frequency of said input signal and changes said initial measurement by a predetermined amount to obtain said coarse measurement.

18. The circuit of claim 14 further comprising a logic circuit to select one of a plurality of gas sensors to provide said input signal.

19. An electrical circuit for measuring the frequency of an input signal, said circuit comprising:
   a) means for generating a coarse measurement of said frequency of said input signal;
   b) means coupled to receive said coarse measurement for generating a reference signal from said coarse measurement having a frequency equal to the frequency represented by said coarse measurement;
   c) means for generating a fine measurement representing the difference in frequency between said input signal and said reference signal; and
   d) means for summing said coarse measurement and said fine measurement, thereby obtaining a final measurement indicative of said frequency of said input signal.

20. The circuit of claim 19 wherein said frequency of said reference signal is lower than said frequency of said input signal.

21. A method for measuring the frequency of an input signal using an electrical circuit, said method comprising:
   a) generating a coarse measurement of said frequency of said input signal;
   b) applying said coarse measurement to a frequency synthesizer to generate a reference signal having a frequency equal to the frequency represented by said coarse measurement;
   c) generating a fine measurement representing the difference in frequency between said input signal and said reference signal; and
   d) summing said coarse measurement and said fine measurement, thereby obtaining a final measurement indicative of the frequency of said input signal.

22. The method of claim 21 wherein said frequency of said reference signal is lower than said frequency of said input signal.

23. The method of claim 21 wherein said first step further comprises generating an initial measurement approximating said frequency of said input signal and changing said initial measurement by a predetermined amount to obtain said coarse measurement.

24. The method of claim 21 wherein said third step comprises digitally mixing said input signal and said reference signal.

25. A method for measuring the concentration of a gas, said method utilizing an electrical circuit and comprising the steps of:
   a) exposing a gas sensor to said gas, said gas sensor generating an input signal having a frequency indicative of said concentration of said gas;
   b) generating a coarse measurement of said frequency of said input signal;
   c) applying said coarse measurement to a frequency synthesizer to generate a reference signal having a frequency equal to the frequency represented by said coarse measurement;
   d) generating a final measurement representing the difference in frequency between said input signal and said reference signal; and
   e) summing said coarse measurement and said fine measurement, thereby obtaining a final measurement indicative of said concentration of said gas.

26. The method of claim 25 wherein said frequency of said reference signal is lower than said frequency of said input signal.

27. An electrical circuit for measuring the frequency of an input signal, said circuit comprising:
   a) a counter connectable to said input signal for generating a coarse measurement of said frequency of said input signal;
   b) a frequency synthesizer connected to said counter for generating a reference signal having a frequency equal to the frequency represented by said coarse measurement;
   c) a difference circuit for generating a fine measurement representing the difference in frequency between said input signal and said reference signal, said difference circuit including
      a digital mixer connected to receive said input signal and said reference signal for generating a pulse width modulated signal,
      a low pass filter connected to said digital mixer for integrating said pulse width modulated signal to generate a sinusoidal signal,
      a logic gate connected to said low pass filter for converting said sinusoidal signal to a square wave signal, and
      a timer connected to said logic gate for measuring the frequency of said square wave; and
   d) a summing circuit connected to said counter and said difference circuit, for summing said coarse measurement and said fine measurement, thereby obtaining a final measurement indicative of said frequency of said input signal;
   said counter, said timer, and said summing circuit being implemented in an embedded controller.

28. An electrical circuit for measuring the frequency of an input signal, said circuit comprising:
   a) a plurality of counters connectable to said input signal, each of said counters having an output, said outputs being concatenated to produce a coarse measurement of said frequency of said input signal;
   b) a frequency synthesizer connected to said counter for generating a reference signal having a frequency equal to the frequency represented by said coarse measurement;
   c) a difference circuit for generating a fine measurement representing the difference in frequency between said input signal and said reference signal, said difference circuit including
      a digital mixer connected to receive said input signal and said reference signal for generating a pulse width modulated signal,
      a low pass filter connected to said digital mixer for integrating said pulse width modulated signal to generate a sinusoidal signal,
      a logic gate connected to said low pass filter for converting said sinusoidal signal to a square wave signal, and
      a timer connected to said logic gate for measuring the frequency of said square wave; and
   d) a summing circuit connected to said counter and said difference circuit, for summing said coarse measurement and said fine measurement, thereby obtaining a final measurement indicative of said frequency of said input signal.

* * * * *